US005164549A

United States Patent [19]

Wolf

[11] Patent Number: 5,164,549

[45] Date of Patent: Nov. 17, 1992

[54] SONIC WAVE GENERATOR

[76] Inventor: Daniel Wolf, 9200 Prospect Ave., Louisville, Ky. 40222

[21] Appl. No.: 515,228

[22] Filed: Apr. 27, 1990

[51] Int. Cl.[5] ............ H05K 5/00

[52] U.S. Cl. ............ 181/147

[58] Field of Search ............ 181/144, 145, 147, 154, 181/155, 199; 381/90

[56] References Cited

U.S. PATENT DOCUMENTS

| | | | |
|---|---|---|---|
| 4,063,387 | 12/1977 | Mitchell | 181/199 X |
| 4,134,471 | 1/1979 | Queen | 181/147 |
| 4,200,170 | 4/1980 | Williams, Jr. | 181/155 |
| 4,878,561 | 11/1989 | Tengstrand et al. | 181/144 X |
| 4,908,601 | 3/1990 | Howze | 181/144 X |

FOREIGN PATENT DOCUMENTS 375994 7/1932 United Kingdom .

*Primary Examiner*—L. T. Hix
*Assistant Examiner*—Khanh Dang
*Attorney, Agent, or Firm*—Charles G. Lamb

[57] ABSTRACT

A sonic wave generator includes at least one pair of concave acoustic baffles arranged in concavely facing relationship in mutual coaxial alignment. The facing acoustic baffles of the pair are spaced apart from each other by a predetermined distance so that an annular opening is formed between the peripheral edges of the openings of the facing concave baffles. A driven diaphram is located at the closed end of each audio baffle opposite the open end of the baffle. The driven diaphrams located in the baffle pair face toward each other in mutual coaxial alignment and in coaxial alignment with the acoustic baffles.

35 Claims, 2 Drawing Sheets

SONIC WAVE GENERATOR

BACKGROUND OF THE INVENTION

1. Field of the Invention

The present invention relates to the field of sonic wave generators and more particularly to a sonic wave generator which accurately reproduces an incoming signal as a sound and which projects the sound uniformly over an area 360 degrees centered on the speaker system.

2. Description of the Prior Art

Over the years there have been many attempts to design sonic wave generators with improved sound reproduction fidelity.

The following U.S. Patents are representative of these attempts. U.S. Pat. No. 1,642,124 issued on Sep. 13, 1927 to F. E. Miller et al; U.S. Pat. No. 1,696,305 issued on Dec. 25, 1928 to M. R. Hutchison; U.S. Pat. No. 1,677,605 issued on Jul. 17, 1928 to S. Strobino; U.S. Pat. No. 1,734,377 issued on Nov. 5, 1929 to J. B. Hawley; U.S. Pat. No. 1,787,946 issued on Jan. 6, 1931 to W. D. LaRue; U.S. Pat. No. 1,819,183 issued on Aug. 18, 1931 to I. Ludlow; U.S. Pat. No. 2,297,972 issued on Oct. 6, 1942 to B. E. Mills; U.S. Pat. No. 2,832,843 issued on Apr. 29, 1958 to B. F. Miessner; U.S. Pat. No. 2,989,597 issued on Jun. 20, 1961 to J. A. Victoreen; U.S. Pat. No. 3,015,366 issued on Jan. 2, 1962 to G. M. Bishop; U.S. Pat. No. 3,022,377 issued on Feb. 20, 1962 to L. J. Bobb et al; U.S. Pat. No. 3,202,773 issued on Aug. 24, 1965 to B. W. Tichy; U.S. Pat. No. 3,371,742 issued on Mar. 5, 1968 to D. H. Norton et al; U.S. Pat. No. 3,477,540 issued on Nov. 11, 1969 to A. Rizo-Patron R.; U.S. Pat. No. 3,512,606 issued on May 19, 1970 to S. C. Anastin; U.S. Pat. No. 4,016,953 issued on Apr. 12, 1977 to R. J. Butler; U.S. Pat. No. 4,039,044 issued on Aug. 2, 1977 to O. Heil; and U.S. Pat. No. 4,107,479 issued on Aug. 15, 1978 to O. Heil.

Of the above-listed patents, U.S. Pat. Nos. 1,696,305; 1,819,183; 2,297,972; 2,832,843; 3,477,540; and 4,016,953 show two speakers in facing relationship and U.S. Pat. Nos. 1,734,377 and 3,477,540 show two speakers facing, spaced apart relationship. U.S. Pat. No. 3,015,366 shows sound propagating mechanisms located in coaxial sequential series by size.

These prior art audio systems have various drawbacks which adversely effect the accuracy of sound reproduction and the sound projection.

SUMMARY OF THE INVENTION

The present invention recognizes the drawbacks of the prior art systems and provides a straightforward sonic wave generator which obviates these drawbacks.

More particularly, the present invention provides in one embodiment, a sonic wave generator comprising at least one pair of concave acoustic baffles concavely facing each other in mutual coaxial alignment and spaced apart from each other a predetermined distance whereby the peripheral edges of the opening of the concave baffles cooperate to define an annular opening therebetween, and a driven diaphram located at the closed end of each acoustic baffle opposite the open end of the baffle, the driven diaphrams facing each other in mutual coaxial alignment and in coaxial alignment with the acoustic baffles.

In another embodiment, the present invention provides a sonic wave generator comprising a plurality of pairs of concave acoustic baffles, the two acoustic baffles of each baffle pair concavely face each other in mutual coaxial alignment and are spaced apart from each other a predetermined distance whereby the peripheral edges of the opening of the concave baffles cooperate to define an annular opening therebetween; each pair of acoustic baffles being of a different size than the other pairs of acoustic baffles, a pair of driven diaphrams associated with each pair of acoustic baffles, a driven diaphram located at the closed end of each acoustic baffle; the pair of driven diaphrams associated with each acoustic baffle pair face toward each other in mutual coaxial alignment and in coaxial alignment with the acoustic baffle pair in which the driven diaphram pair is located; and each pair of driven diaphrams being sized to operate over a different frequency range than the other pairs of driven diaphrams.

BRIEF DESCRIPTION OF THE DRAWINGS

A better understanding of the present invention will be had upon reference to the following description in conjunction with the accompanying drawings wherein.

DETAILED DESCRIPTION OF THE PREFERRED EMBODIMENT

Figure 1:
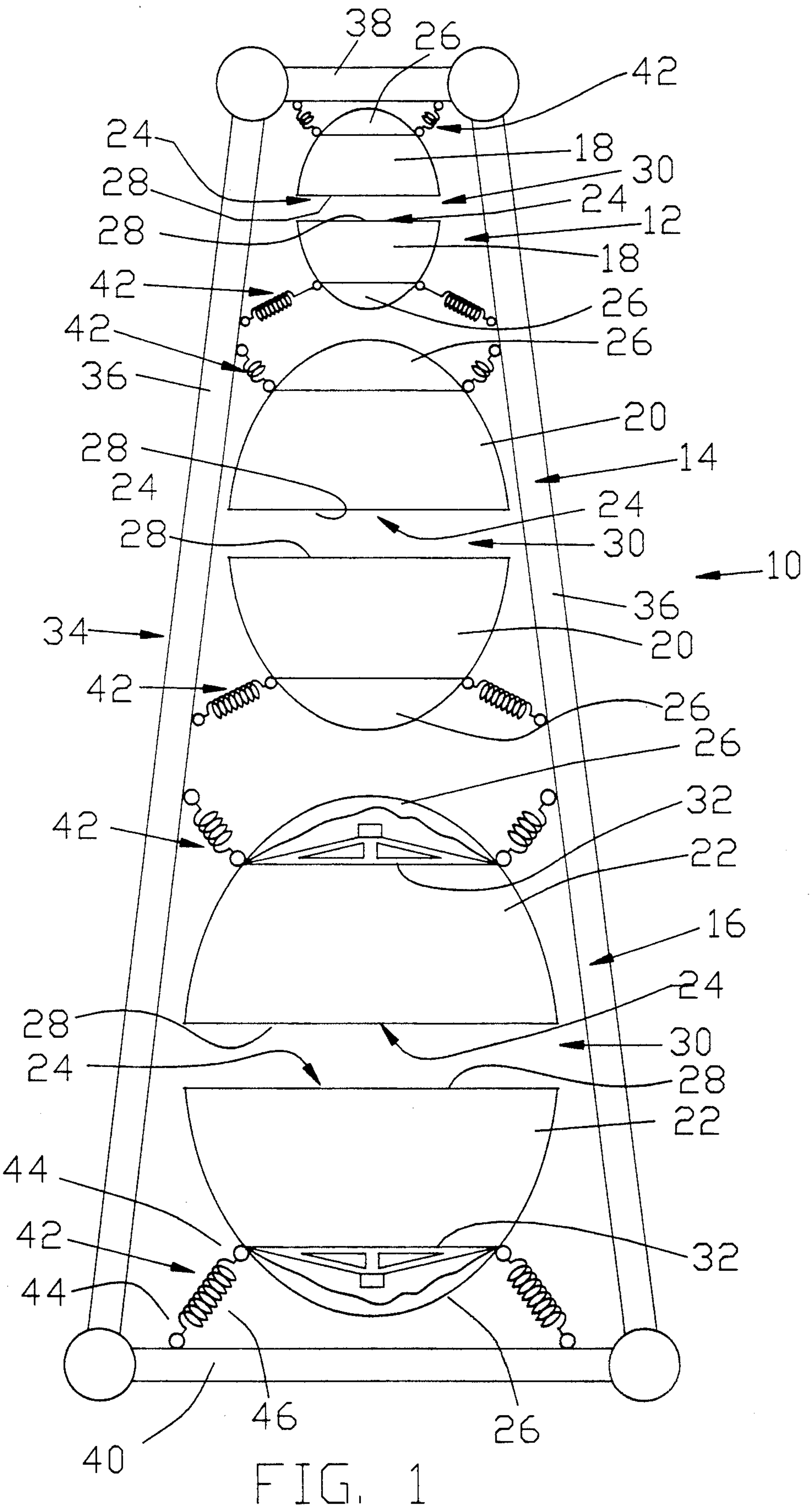
FIG. 1 is a side view of an a sonic wave generator embodying the present invention with portions broken away to show internal details.

With reference to the drawing, there is shown a sonic wave generator, generally denoted as the numeral 10, of the present invention. The sonic wave generator 10 has a plurality of pairs 12, 14 and 16 of acoustic baffles 18, 20 and 22, respectively. As shown, the sonic wave generator 10 has three pairs of acoustic baffles. One acoustic baffle pair 16 is for a low audio frequency range, another acoustic baffle pair 14 is for a mid-range audio frequency range, and yet another baffle pair 12 is for a high audio frequency range. The physical size of the acoustic baffles 22 of the low audio frequency pair 16 are larger than the baffles 20 of the mid-range frequency pair 14, and the baffles 20 are larger than the baffles 18 of the high audio frequency range pair 12. Preferably, the ratio of the physical size of the baffles 22 to the baffles 20 is the same as the ratio of the physical size of the baffles 20 to the baffles 18. For example, if the baffle 20 is 0.66 the size of the baffle 22, then the baffle 18 is 0.66 the size of the baffle 20.

The baffles 18, 20 and 22, and the baffle pairs 12, 14 and 16 are essentially identical except for size, as discussed hereinbefore. Therefore, for the sake of brevity and clearness of understanding, only the baffle pair 16 and the acoustic baffles 22 forming the baffle pair 16 will be described, it being understood that the description applies equally to the other baffle pairs 12 and 14, and the acoustic baffles 18 and 20.

The acoustic baffles 22 are concave in shape having an open end 24 and a closed end 26 opposite the open end 24. The acoustic baffles 22 of the baffle pair 16 concavely face each other in mutual coaxial alignment. The acoustic baffles 22 are spaced apart from each other along the coaxis of alignment a predetermined distance whereby the peripheral edges 28 of the open end 24 of the baffles 22 cooperate to define an annular opening generally denoted by the numeral 30, therebetween.

Preferably, the area of the annular opening 30 is somewhat less than the area of the driven diaphrams 32. This sizing of the annular opening 30 increases the velocity of the air as it exits through the annular opening 30 providing a slight back pressure in the baffles 22 which tends to shunt harmonic resonance.

A driven diaphram 32 is located at the closed end of each acoustic baffle 22 opposite the open end 4 of the acoustic baffle 22. The driven diaphrams 32 face each other in mutual coaxial alignment, and also in coaxial alignment with the acoustic baffle 22 of the baffle pair 16. The driven diaphrams 32 are of equal diameter, and the distance from each driven diaphram t the centerline of the annular opening 30, measured along the axis of alignment, is twice the driven diaphram diameter. This relationship provides a half wave air column between the two driven diaphrams 32 with a sound radiating zone at the geometric center of the baffle pair 16.

With continued reference to FIG. 1, the acoustic baffle 22 is parabolic in shape. The walls of the acoustic baffle are preferably fabricated of a sound reflecting material such as, for example, aluminum or brass. Furthermore, the walls of the acoustic baffle 22 are preferably homogenous without any discontinuities or seams. Toward this objective, the acoustic baffle 22 can be fabricated by a spinning process.

Figure 2:
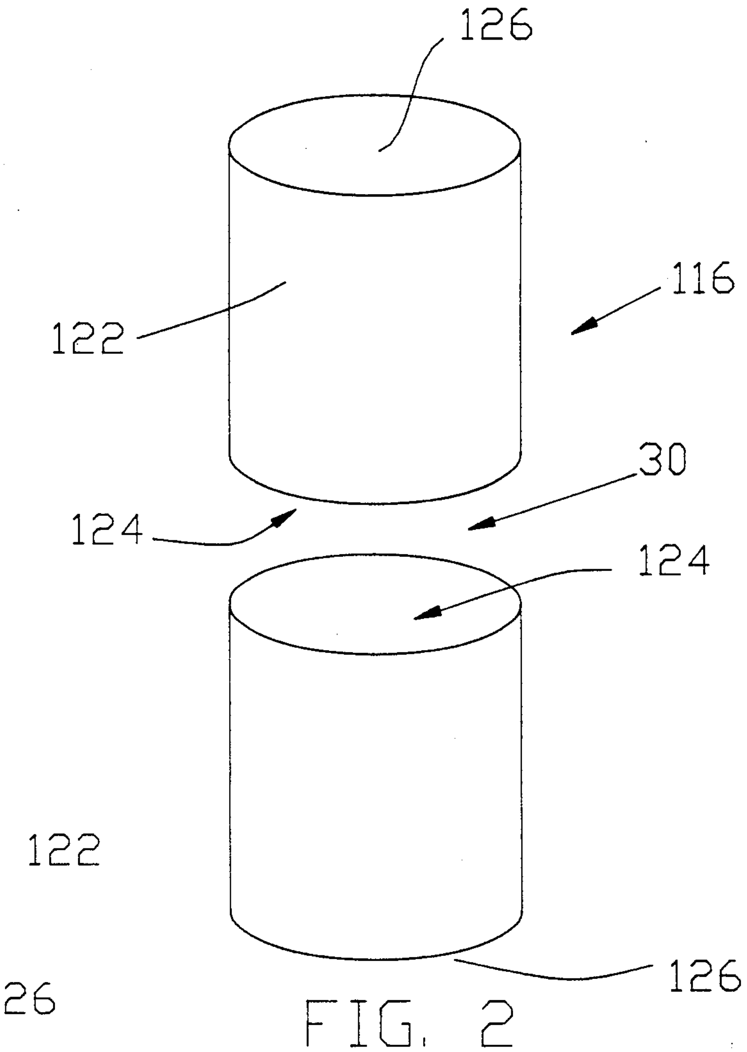
FIG. 2 is a side view of one embodiment of a component of the sonic wave generator of FIG. 1.

With reference to FIG. 2, there is shown one embodiment of an acoustic baffle 122 which is generally cylindrical in shape having one open end 124 and an opposite closed end 126.

Figure 3:
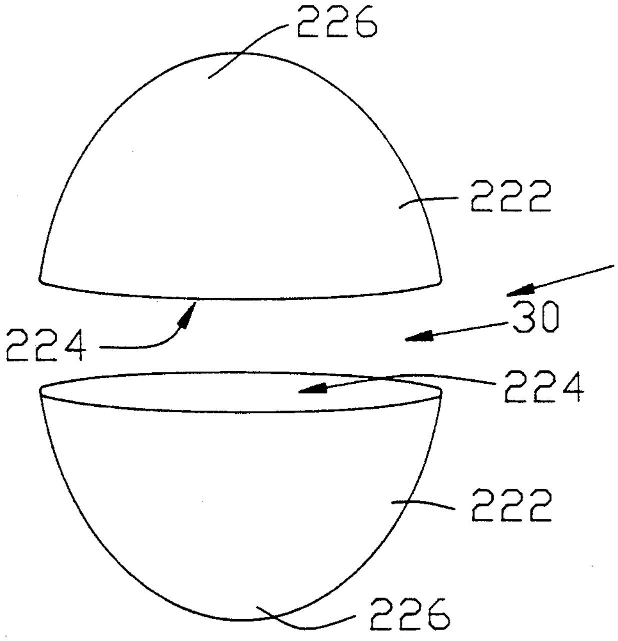
FIG. 3 is a side view of another embodiment of a component of the sonic wave generator of FIG. 1.

FIG. 3 shows another embodiment of an acoustic baffle 222 which is hemispherical in shape having an open end 224.

With reference once again to FIG. 1, the sonic wave generator 10 also includes a support structure 34. As shown, the support structure 34 is formed of a plurality of elongated side beams 36 interconnected at their top ends by top braces 38 and interconnected at their bottom ends by bottom braces 40. The details of the support structure 34 are incidental. The main criteria of the support structure 34 is that it be open so as not to interfere with sound transmission. The baffle pairs 12, 14 and 16 are mounted in the support structure in mutual coaxial alignment with the coaxis of alignment being vertically oriented.

The acoustic baffles 20, 22 and 24 of the baffle pairs 12, 14 and 16, respectively are attached individually of each other to the support structure by attachment means, generally denoted as the numeral 42. The attachment means 42 comprises resilient means 44 such as two coil springs arranged in longitudinal alignment with dampening means 46, such as a section of rigid plastic material, located between and interconnecting the two coil springs. The free end of one coil spring is connected to the support structure 34 and the free end of the other coil spring is attached to the acoustic baffles. Thus, each audio baffle is individually resiliently supported in the support structure 34.

With continued reference to FIG. 1, each pair 12, 14 and 16 of acoustic baffles 18, 20 and 22 is of a different size than the other baffle pairs and are sequentially arranged according to baffle size. In addition, each pair of driven diaphrams 24 associated with each baffle pair 12, 14 and 16 is sized to operate over a different frequency range than the other pairs of driven diaphrams. For example, the pair of driven diaphrams 24 associated with the baffle pair 16 are sized to operate in a low frequency range of, for example, 20–500 cycles, the pair of driven diaphrams 24 associated with the baffle pair 14 are sized to operate in a mid-frequency range of, for example, 500–2000 cycles, and the pair of driven diaphrams 24 associated with the baffle pair 12 are sized to operate in a high frequency range of, for example, 2000–6000 cycles. It is also contemplated that the different frequency ranges which the different pairs of driven diaphrams operate overlap. For example, the pair of driven diaphrams 24 of the baffle pair 16 could operate in a low frequency range of 20–500 cycles; the pair of driven diaphrams 24 of baffle pair 14 could operate in a mid frequency range of 450–2000 cycles; and the pair of driven diaphrams 24 of the baffle pair 12 could operate in a high frequency range of 1950–6000 cycles.

It is contemplated that the driven diaphrams 24 of each driven diaphram pair be operatively connected in series so as to operate in phase with each other, and alternatively that the driven diaphrams 24 of each driven diaphram pair be operatively connected in parallel so as to operate out of phase with each other.

The foregoing detailed description is given primarily for clearness of understanding and no unnecessary limitations should be understood therefrom for modifications will become obvious to those skilled in the art upon reading this disclosure and may be made without departing from the spirit of the invention or scope of the appended claims.

What is claimed is:

1. A sonic wave generator comprising:

at least one pair of concave acoustic baffles, each concave acoustic baffle being generally cylindrical in shape and formed with an open end defined by a peripheral edge and a closed end opposite the open end concavely facing each other in mutual coaxial alignment and spaced apart from each other a predetermined distance whereby the peripheral edge of the open ends of the concave baffles cooperate to define an annular opening therebetween; and, a driven diaphragm located at the closed end of each acoustic baffle opposite the end of the baffle, the driven diaphragms facing each other in mutual coaxial alignment and in coaxial alignment with the coaxial baffles.

2. A sonic wave generator comprising:

at least one pair of concave acoustic baffles, each concave acoustic baffle being generally hemispherically shaped, and formed with an open end defined by a peripheral edge and a closed end opposite the open end concavely facing each other in mutual coaxial alignment and spaced apart from each other a predetermined distance whereby the peripheral edge of the open ends of the concave baffles cooperate to define an annular opening therebetween; and a driven diaphragm located at the closed end of each acoustic baffle opposite the end of the baffle, the driven diaphragms facing each other in mutual coaxial alignment and in coaxial alignment with the coaxial baffles.

3. A sonic generator comprising:

at least one pair of concave acoustic baffles, each concave acoustic baffle being generally parabolic, and formed with an open end defined by a peripheral edge and a closed end opposite the open end concavely facing each other in mutual coaxial alignment and spaced apart from each other a predetermined distance whereby the peripheral edge of the open ends of the concave baffles cooperate to define an annular opening therebetween; and, a driven diaphragm located at the closed end of each acoustic baffle opposite the end of the baffle, the driven diaphragms facing each other in mutual coaxial alignment and in coaxial alignment with the coaxial baffles.

4. The sonic wave generator of claim 1, wherein:

the driven diaphrams are of equal diameter; and the distance between each of the driven diaphrams to the centerline of the annular opening measured along the coaxis of alignment is twice the driven diaphram diameter.

5. The sonic wave generator of claim 1, wherein the coaxis of alignment is vertical.

6. The sonic wave generator of claim 1, further comprising:

a support structure; and means for attaching the acoustic baffles to the support structure.

7. The sonic wave generator of claim 6, wherein the acoustic baffle attachment means comprises resilient means for resiliently supporting the acoustic baffles to the support structure.

8. The sonic wave generator of claim 7, wherein the acoustic baffle attachment means comprises dampening means for dampening the motion of the resilient means.

9. The sonic wave generator of claim 6, wherein the acoustic baffle attachment means attaches the acoustic baffles individually of each other to the support structure.

10. The sonic wave generator of claim 1, wherein the driven diaphrams are operatively connected so as to operate in phase with each other.

11. The sonic wave generator of claim 1, wherein the driven diaphrams are operatively connected so as to operate out of phase with each other.

12. A sonic wave generator comprising:

a plurality of pairs of concave acoustic baffles, each baffle formed with an open end defined by a peripheral edge and a closed end opposite the open end, the acoustic baffles of each baffle pair concavely face each other in mutual coaxial alignment and are spaced apart from each other a predetermined distance whereby the peripheral edges of the open ends of the concave baffles cooperate to define an annular opening therebetween;

each pair of acoustic baffles being of a different size than the other pairs of acoustic baffles;

a pair of driven diaphrams associated with each pair of acoustic baffles, a driven diaphram located at the closed end of each acoustic baffle, the pair of driven diaphrams associated with each acoustic baffle pair face each other in mutual coaxial alignment and in coaxial alignment with the acoustic baffle pair in which the driven diaphram is located; and, each pair of driven diaphrams being sized to operate over a different frequency range than the other pairs of driven diaphrams.

13. The sonic wave generator of claim 12, wherein the different frequency ranges at which the different pairs of driven diaphrams operate overlap.

14. The sonic wave generator of claim 12, wherein the plurality of pairs of acoustic baffles are in mutual coaxial alignment.

15. The sonic wave generator of claim 14, wherein the plurality of pairs of acoustic baffles are sequentially arranged according to baffle size.

16. The sonic wave generator of claim 12, further comprising:

a support structure; and means for attaching the acoustic baffles to the support structure.

17. The sonic wave generator of claim 16, wherein the acoustic baffle attachment means includes resilient means for resiliently supporting the acoustic baffles to the support structure.

18. The sonic wave generator of claim 17, wherein the acoustic baffle attachment includes dampening means for dampening motion of the resilient means.

19. The sonic wave generator of claim 16, wherein the acoustic baffle attachment means attaches the acoustic baffles individually of each other to the support structure.

20. The sonic Wave generator of claim 12, wherein the drive diaphram of each driven diaphram pair are operatively connected so as to operate in phase with each other.

21. The sonic wave generator of claim 12, wherein the driven diaphram of each driven diaphram pair are operatively connected so as to operate out of phase with each other.

22. The sonic wave generator of claim 2, wherein:

the driven diaphragms are of equal diameter; and the distance between each of the driven diaphragms to the centerline of the annular opening measured along the axis of alignment is twice the driven diaphragm diameter.

23. The sonic wave generator of claim 3, wherein:

the driven diaphragms are of equal diameter; and the distance between each of the driven diaphragms to the centerline of the annular opening measured along the axis of alignment is twice the driven diaphragm diameter.

24. The sonic wave generator of claim 2, wherein the coaxis of alignment is vertical.

25. The sonic wave generator of claim 3, wherein the coaxis of alignment is vertical.

26. The sonic wave generator of claim 2, further comprising:

a support structure; and means for attaching the acoustic baffles to the support structure.

27. The sonic wave generator of claim 3, further comprising:

a support structure; and means for attaching the acoustic baffles to the support structure.

28. The sonic wave generator of claim 26, wherein the acoustic baffle attachment means comprises resilient means.

29. The sonic wave generator of claim 27, wherein the acoustic baffle attachment means comprises resilient means.

30. The sonic wave generator of claim 28, wherein the acoustic baffle attachment means comprises dampening means.

31. The sonic wave generator of claim 29, wherein the acoustic baffle attachment means comprises dampening means.

32. The sonic wave generator of claim 26, wherein the acoustic baffle attachment means attaches the acoustic baffles individually of each other to the support structure.

33. The sonic wave generator of claim 27, wherein the acoustic baffle attachment means attaches the acoustic baffles individually of each other to the support structure.

34. The sonic wave generator of claim 2, wherein the driven diaphragms are operatively connected so as to operate out of phase with each other.

35. The sonic wave generator of claim 3, wherein the driven diaphragm are operatively connected so as to operate out of phase with each other.

* * * * *